HEAT CONDUCTIVE RESILIENTLY COMPRESSIBLE STRUCTURE FOR SPACE ELECTRONICS PACKAGE MODULES

Filed Oct. 5, 1962

INVENTORS
FREDERICK W. JOHNSON
HARRY M. PASSMAN
BY
Woody and Kintzinger
ATTORNEYS United States Patent Office 3,212,564

Patented Oct. 19, 1965

3,212,564

HEAT CONDUCTIVE RESILIENTLY COMPRESSIBLE STRUCTURE FOR SPACE ELECTRONICS PACKAGE MODULES

Harry M. Passman and Frederick W. Johnson, Cedar Rapids, Iowa, granted to National Aeronautics and Space Administration under the provisions of 42 U.S. Code 2457(d)

Filed Oct. 5, 1962, Ser. No. 229,286
16 Claims. (Cl. 165—47)

This invention relates to the cooling and mounting of rack mounted electronic packaged modules and in particular to heat conductive and space variation adapting resiliently deflective multi-parallel leaf heat conductive and padding means bridging the space between a module to be cooled and a rack shelf, also a heat absorbing body, that may carry circulating liquid coolant.

Rack mounted electronic equipment modules are being called upon, more and more frequently, to operate under conditions where gaseous convection is inadequate for cooling. This may be encountered with modules mounted in radio racks of space craft, high altitude flying aircraft, and for other installations operating under full atmosphere where gaseous convection is inadequate through air for holding equipment and module temperatures below desired limits. In some module rack mountings, similar to some used by commercial airlines, liquid coolant is run within the shelf, and it is desired that heat be conducted from module equipment to the mounting shelf (acting as a heat sink) with the smallest possible temperature differential between the module and the shelf.

Waviness and deflection of the shelf and of equipment module mating surfaces may be such as to prevent obtaining intimate metal-to-metal contact over any significant area of their adjacent mating surfaces, even though portions of the modules may be solidly clamped to the shelf. An air gap of a few thousandths of an inch between contiguous metal bodies causes very high thermal resistance in a thin atmosphere and, particularly so, under vacuum conditions. Many resilient materials have been tried, including silicone rubber, foam plastic, woven screen materials, spring fingers of the conventional type, and the like, in efforts to obtain good conduction between a body to be cooled and a heat sink without achieving the desired results. Many situations arise in equipment design where multiple thermal conductive paths are needed for spanning a space, of varying tolerances, between bodies subject to relative movement. This could exist, for example, where one of the parts is a plug-in subassembly, component part, or a module removably mounted in a rack.

It is therefore, a principal object of this invention to provide thermal conductive multiple path means between electronic equipment modules (bodies to be cooled) and a rack shelf (a heat sink).

A further object is to provide thermal conductive multiple path means with good thermal contact between the conductive means and both a body to be cooled, and a heat sink throughout, the extremes of mechanical position tolerances that may be expected between the body to be cooled and the heat sink.

A further object is to span the variable gap between a removably mounted module and a rack shelf with heat conductive path means that will effectively transfer heat from the module to the shelf in a hard vacuum.

Features in the accomplishment of these objects include the provision of multiple parallel sheets of material fixed to either the body to be cooled or to the heat sink body, as by brazing or soldering. These sheets of material are preferably of a resiliently deflective metal, such as beryllium copper, having relatively low thermal conductive resistance, and for further improvement, in providing extremely low thermal resistance, the sheets may be plated by silver or gold. For example, silver plating of 0.0002 inch on each side of a beryllium copper sheet 0.0015 inch thick, reduces the thermal resistance to less than half the thermal resistance for an unplated beryllium copper sheet. Sheets of beryllium copper, precious metal plated or not, as the case may be, for various design requirements, are stacked in close proximity to each other and attached to the base of the module as by brazing or soldering. Such connection, as by silver solder, results in an extremely low thermal resistance between the module and the generally parallel stacked beryllium copper sheets. The sheets are substantially touching, although sufficient space tolerance is provided for resilient deflection of the sheets through the maximum space tolerance range expected and the sheets are so dimensioned and designed as to exert resilient deflective force against the mounting shelf at maximum space tolerances to be expected between the module and the shelf. This provides for each beryllium copper sheet to have intimate metal-to-metal contact with the shelf throughout the length of each sheet, even with a considerable variation in space tolerance and with relative movement between the module and a rack shelf. Spring forces exerted by the beryllium copper sheets, acting as a pad, have measured in the range of from 1 to 10 pounds per square inch against the surface of a rack shelf. Furthermore, thermal resistance has been cut to less than 3° centigrade per square inch per watt dissipated from module to a shelf through these stacked sheets collectively as a pad.

A feature of an alternate embodiment is chevron shaped strips of beryllium copper having good thermal conductivity. These strips are mechanically and thermally attached as generally parallel stacked strips attached to a surface of a module. Each strip has an end of its chevron V shape flattened for a position of contact with a shelf compatible to the nominal compressed position of strip positions through the range of space tolerances. This structure provides a compressive load generally normal to the adjacent surface against which the chevron leaves are exerting resilient force.

Another feature of some installations is a relatively thin leveling plate sufficiently thin to generally conform to waviness and deflection of a shelf surface. This provides for improved and easier handling with the parallel strips of thermally conductive pads in installation of a module unit on a rack shelf, and where provision must be made for relative movement between a unit and a shelf. Some thermal conductivity advantage is sacrificed by use of a leveling plate, however, this is a matter of balancing design advantages, in handling against some sacrifice in heat transfer characteristics. Some embodiments feature an interlocking and self-jigging of thermal pad sheets for maintenance of design spacing between sheets through brazing, or soldering, assembly operations and for the finished mounted thermal pad.

Specific embodiments representing what are presently regarded as the best modes of carrying out the invention are illustrated in the accompanying drawing.

Figure 3:
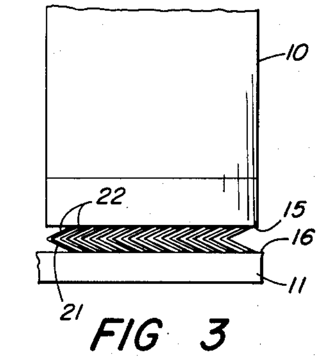
Figure 4:
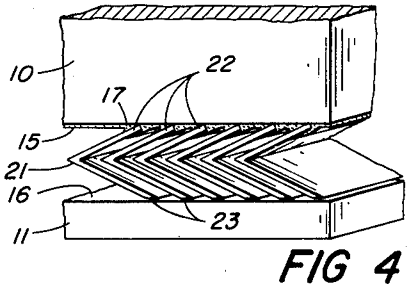
Figure 5:
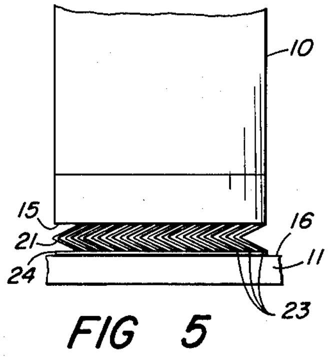
Figure 6:
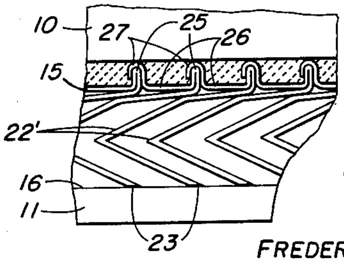

FIGURE 3, an end view of a thermal pad of chevron shaped sheets between a module and a shelf;

FIGURE 4, an enlarged detailed view of the FIGURE 3 embodiment, showing chevron sheet mounting detail, and sheet flattened edge metal-to-metal contact with a mounting shelf;

FIGURE 5, a chevron sheet thermal pad, similar to the FIGURE 3 and FIGURE 4 embodiment, utilizing a leveling plate between chevron sheet edges and the rack shelf; and FIGURE 6, a chevron sheet embodiment similar to those of FIGURES 3 and 5, with an interlocking and self-jigging of thermal pad sheets in place of the direct mounting shown in FIGURE 4.

Figure 1:
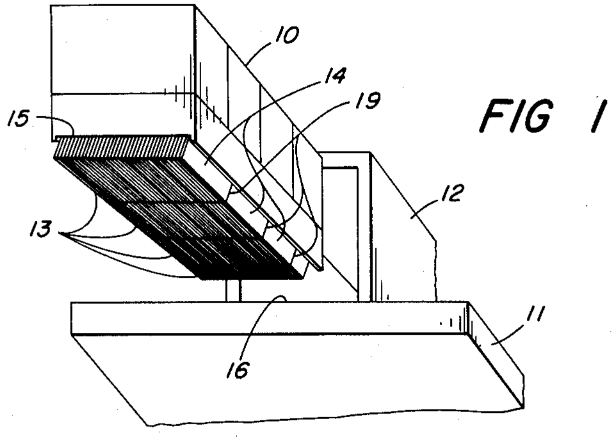
FIGURE 1 represents a perspective view of an electronic module unit equipped with a parallel sheet thermal pad, the rack shelf for mounting the module, and means for holding the module in place with the thermal pad in intimate metal-to-metal contact against the shelf.

Referring to the drawing:

A module 10 is shown in FIGURE 1, ready for installation in its removable mounting on rack shelf 11 by insertion into the compartment formed by enclosure 12 on rack shelf 11. Multiple pad sections 13 comprised of stacked parallelled sheets 14 are fastened to module bottom surface 15. The module 10 is so contained when fully inserted within compartment 12 that the thermal pad sheets 14 are each partially deflected in the limited spacing between module surface 15 and the upper surface 16 of rack shelf 11.

Figure 2:
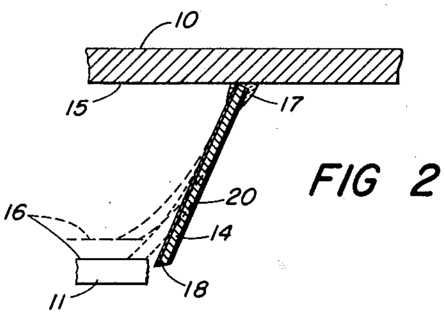
FIGURE 2 shows detail of a single thermal pad sheet and its mounting to a module surface, the free undeflected sheet position, as well as deflected positions in phantom for the extremes of tolerance spacing between the module and the rack shelf.

Referring also to FIGURE 2, a single thermal pad sheet 14 is shown to be mounted on surface 15 as by a brazed or soldered connection 17. Such connection of sheet 14 to the module surface 15, particularly with silver solder, results in extremely low thermal resistance between the module 10 and the stacked generally parallel beryllium copper sheets 14. Thermal pad sheets 14 are mounted at a slant, adapted for resilient deflection in adapting to the spacing of rack surface 16 from module surface 15. This spacing varies through a tolerance range, for example, from the surface 16 position of maximum spacing, indicated in solid, to the minimum spacing 16, indicated in phantom as shown in FIGURE 2. Tolerance variations in excess of $\frac{1}{16}$ of an inch can be accommodated.

The bottom edges 18 of thermal pad sheets 14 are machined at a bevel to give maximum metal-to-metal contact with rack shelf 11 with the sheets 14 deflected for the median spacing between the maximum and minimum spacing tolerance positions indicated in FIGURE 2. This may be accomplished, after the beryllium copper sheets 14 have been brazed to the module surface 15, by machine grinding the bevel edges 18 with the sheets 14 in the median deflected position.

With relatively short modules, parallel sheets 14 could extend the full length thereof and provide a single thermal pad 13. However, in order to prevent buckling of sheets 14 with increased lengths of pads 13 and sheets 14, they may include transverse slots, as indicated at 19 in FIGURE 1, or individual leaves 14 could be slotted at various points and in staggering relationship one to the other. Thermal pads 13 have been constructed, using beryllium copper sheets in the order of 0.0015 inch thick extending approximately one-half inch from their brazed mounting on surface 15 to the edges 18, and extend longitudinally the length of the module, or to shorter lengths as determined by slots 19.

Sheets 14 of beryllium copper have been plated with a very thin coating of silver 20 (gold could be also employed) for improving thermal conduction from a module surface 15 to a shelf 11. For example, silver plating 0.0002 inch thick on each side of the sheets 14, has been found to reduce the temperature differential from surface 15 through the sheets 14 to surface 16 of shelf 11 to less than half the temperature differential with uncoated beryllium copper sheets 14. It should be noted that these relatively thin copper sheets resiliently conform and urge the beveled ends 18 into good metal-to-metal contact for minimum thermal resistance with surface 16 throughout their longitudinal length, even though waviness and deflection of the shelf may vary between the surface 16 extremes, indicated in FIGURE 2.

Reference to FIGURE 3 shows a thermal pad 21, utlized in place of the pads 13, having chevron shaped, or what may be considered V shaped, thermal pad sheets 22, replacing the thermal pad sheets 14 of thermal pads 13. These chevron shaped sheets 22, assembled in stacked generally parallel spaced relation in the form of pads 21, are formed from strips of beryllium copper, or other suitable spring material, and have good thermal conductivity, just as with thermal pad sheets 14. This provides a very effective thermal pad for spanning the variable gap between module 10 and shelf 11, a heat sink, with multiple thermal conductive sheets 22 effectively transferring heat from the module 10, even in a hard vacuum.

Beryllium copper chevron V shaped sheets 22 may be precious metal plated for improving thermal conduction just as with sheets 14, and are mechanically and thermally attached by brazing or soldering to the bottom of the module 10 in the same manner as with sheets 14. Such brazing or soldered mounting to surface 15 is shown in detail in FIGURE 4, where the upper edges of sheets 22 are embedded and securely fastened in brazing material or solder 17. The other ends 23 of the chevron V shaped sheets 23 are flattened for the nominal median compressed state between the maximum and minimum of space tolerance positions of surface 16, in the same manner as has been described for beveled ends 18 of sheets 14, for maximum metal-to-metal contact with surface 16 in the nominal compressed state. This chevron sheet 22 configuration provides for the resiliently compressive forces to be exerted virtually normal to surface 16 of shelf 11 as the sheets 22 resiliently exert compressive force when in position. Further, the chevron configuration of sheets 22 makes it possible to design for very low spring rates even below one pound per square inch of thermal pad 21, if desired.

Please refer now to FIGURE 5 for the addition to a thermal pad 21 of a relatively thin leveling plate 24 between sheet ends 23 and surface 16 of rack shelf 11. This plate is sufficiently thin to generally conform to waviness and deflection of the shelf surface 16 and provides improved and easier handling, and protection for the parallel sheets 22 of the thermally conductive pad or pads 21 and extends for the length of the chevron shaped sheets 22. Leveling plate 24 is helpful for installation of a module on a shelf 11 and where relative movement between a module 10, or a component, and the shelf 11 is likely to be encountered. Obviously, some thermal conductivity advantage is sacrificed by the use of a leveling plate 24, and it is a matter of balancing leveling plate derived advantages in handling and protection provided against some sacrifice in heat transfer characteristics.

Interlocking and self-jigging of thermal pad chevron sheets 22' may be provided by forming of the upper ends of the chevron sheets as shown in FIGURE 6. Here each upper end is shown to be of considerable length, doubled over with a double thickness upward extension 25 and backward extended portion 26 to an upward and doubled over trough portion 27 shaped to receive the upward extension 25 of the next adjacent sheet 22'.

Whereas this invention is here illustrated and described with respect to several specific embodiments thereof, it should be realized that various changes may be made without departing from the essential contribution to the art made by the teachings hereof.

We claim:

1. Cooling apparatus with rack shelf mounted electronic equipment for conducting heat from equipment to be cooled to a mounting rack shelf, acting as a heat sink, comprising in combination; equipment to be cooled; a rack shelf; multiple path thermal conductive pad means bridging space between a surface of the equipment to be cooled and a surface of the rack shelf; said pad means including multi substantially parallel stacked closely spaced thin sheets; said sheets being of resiliently deflectible material having relatively low thermal conductive resistance; each of said sheets being in edgewise contact with both a surface of said equipment and a surface of said mounting shelf and spanning the space between throughout the the longitudinal length of each sheet; and all sheets of a thermal conductive pad being each provided with an extended mounting connection, respectively, at common edges to a common surface.

2. The cooling apparatus of claim 1 wherein, means is provided for mounting said equipment on the shelf with the spacing between said equipment and said shelf held to tolerance limits throughout which said sheets are in a resiliently deflected state.

3. The cooling apparatus of claim 2 wherein, said sheets of a thermal conductive pad are mounted by molten metal formed interconnections to said equipment; and said sheets being slanted from the normal at their respective mountings to the equipment.

4. The cooling apparatus of claim 3 wherein, said sheets are beveled at the bottom for maximum metal-to-metal contact with the shelf.

5. The cooling apparatus of claim 3 wherein, said sheets are formed with an interlock and spacing means embedded, into the molten metal formed interconnections with said equipment.

6. The cooling apparatus of claim 2 wherein, said sheets are chevron V shaped.

7. The cooling apparatus of claim 2 wherein, a relatively thin plate is interspersed between the mounting shelf and edges of the sheets of a thermal conductive pad.

8. The cooling apparatus of claim 7 wherein, said plate is sufficiently thin and flexible to substantially adaptively conform to the waviness and deflections of the surface of the shelf under the loading imposed thereon by the resiliently deflected sheets throughout the area of contact of said thermal conductive pad means with the plate.

9. The cooling apparatus of claim 1 wherein, said sheets are plated by precious metal for extremely low thermal conductive resistance.

10. The cooling apparatus of claim 1 wherein, said sheets are formed of beryllium copper spring metal.

11. Cooling apparatus for a rack mounted module for conducting heat from the module to be cooled to a mounting shelf, acting as a heat sink, comprising in combination: an equipment module to be cooled; a mounting shelf; multiple path thermal conductive pad means bridging the space between a relatively flat surface of the equipment module to be cooled and a relatively flat surface of the mounting shelf; said pad means including multi substantially parallel relatively closely spaced thin sheets; said sheets being of resiliently deflectible material having low thermal conductive resistance; said sheets of the pad means each having an extended edge mounting connection to the same one of said surfaces, and extending from the mountings to span the space between said surfaces throughout the longitudinal length of each sheet; and each of said sheets projecting from its edgewise mounting at a slant to a normal of the mounting surface.

12. The cooling apparatus of claim 11 wherein, the spacing between the surfaces is held to tolerance limits between which said sheets are continuously in a resiliently deflective state.

13. The cooling apparatus of claim 12 wherein, said sheets are formed of sheets of beryllium copper spring metal.

14. The cooling apparatus of claim 13 wherein, said sheets are chevron V shaped.

15. The cooling apparatus of claim 14 wherein, a relatively thin plate is interspersed between the mounting shelf and edges of the sheets of a thermal conductive pad throughout the area of contact with the pad.

16. The cooling apparatus of claim 12 wherein, said sheets are beveled at the bottom for optimum metal-to-metal contact with one of said surfaces.

References Cited by the Examiner

UNITED STATES PATENTS

| | | | |
|---|---|---|---|
| 1,655,273 | 1/28 | Kelley | 165—180 |
| 2,152,331 | 3/39 | Shoemaker | 165—180 |
| 2,694,554 | 11/54 | Lemeshka | 165—80 |
| 2,809,004 | 10/57 | Kaufman et al. | 165—80 |

ROBERT A. O'LEARY, *Primary Examiner.*

FREDERICK L. MATTESON, Jr., PERCY L. PATRICK, SAMUEL FEINBERG, *Examiners.*